(12) United States Patent
Sumitani

(10) Patent No.: US 7,545,683 B2
(45) Date of Patent: Jun. 9, 2009

(54) SEMICONDUCTOR MEMORY DEVICE

(75) Inventor: Ken Sumitani, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 152 days.

(21) Appl. No.: 11/651,455

(22) Filed: Jan. 10, 2007

(65) Prior Publication Data

US 2007/0159895 A1 Jul. 12, 2007

(30) Foreign Application Priority Data

Jan. 11, 2006  (JP)  ............... 2006-003408

(51) Int. Cl.
*G11C 7/10* (2006.01)
(52) U.S. Cl. .................. 365/189.05; 365/189.011; 365/189.04; 365/189.16
(58) Field of Classification Search ............ 365/189.05, 365/189.04, 189.16, 189.011
See application file for complete search history.

(56) References Cited

U.S. PATENT DOCUMENTS

| 5,886,927 A | * | 3/1999 | Takeuchi | ............... 365/185.22 |
| 6,018,478 A | * | 1/2000 | Higuchi | ............... 365/189.14 |
| 6,259,630 B1 | | 7/2001 | Kawamura | |
| 6,944,093 B2 | * | 9/2005 | Sumitani | ............... 365/235 |
| 2004/0193774 A1 | * | 9/2004 | Iwata et al. | ............... 711/1 |

FOREIGN PATENT DOCUMENTS

| JP | 2004-039112 | 2/2004 |
| KR | 2001-0014760 | 2/2001 |

* cited by examiner

*Primary Examiner*—Pho M. Luu
(74) *Attorney, Agent, or Firm*—Morrison & Foerster LLP

(57) ABSTRACT

A semiconductor memory device arranged for minimizing the duration of time required for conducting a batch verify action and thus speeding up a buffer write action is provided. The device which conducts a write action to memory cells in an address area, a batch verify action for collectively conducting verify action for a plurality of addresses, and repeats the batch verify action and the write action, comprises a detecting means for detecting whether or not each address contains an unwritten memory cell, and conducts a verify action at least at a part of the batch verify action excluding at least a part of addresses judged not to contain unwritten memory cells by the verify action at one or more cycles before.

4 Claims, 14 Drawing Sheets

| Address | Data | First Time of Verify Action | | Second Time of Verify Action | | Third Time of Verify Action | | Fourth Time of Verify Action | | Fifth Time of Verify Action | |
|---|---|---|---|---|---|---|---|---|---|---|---|
| | | Readout Data | Buffer Data | Readout Data | Buffer Data | Readout Data | Buffer Data | Readout Data | Buffer Data | Readout Data | Buffer Data |
| 000000h | 0F5Ah | FFFFh | 0F5Ah | 0F5Ah | (3FFFh) | 0F5Ah | FFFFh | 0F5Ah | FFFFh | 0F5Ah | FFFFh |
| 000001h | 0F5Ah | FFFFh | 0F5Ah | 0F5Ah | FFFFh | 0F5Ah | FFFFh | 0F5Ah | FFFFh | 0F5Ah | FFFFh |
| 000002h | 0F5Ah | FFFFh | 0F5Ah | 7F5Ah | (8FFFh) | 3F5Ah | (CFFFh) | 3F5Ah | (CFFFh) | 0F5Ah | FFFFh |
| 000003h | 0F5Ah | FFFFh | 0F5Ah | 0F5Ah | FFFFh | 0F5Ah | FFFFh | 0F5Ah | FFFFh | 0F5Ah | FFFFh |
| 000004h | 0F5Ah | FFFFh | 0F5Ah | 0F5Ah | FFFFh | 0F5Ah | FFFFh | 0F5Ah | FFFFh | 0F5Ah | FFFFh |
| 000005h | 0F5Ah | FFFFh | 0F5Ah | 0F5Ah | FFFFh | 0F5Ah | FFFFh | 0F5Ah | FFFFh | 0F5Ah | FFFFh |
| 000006h | 0F5Ah | FFFFh | 0F5Ah | FF5Ah | (0FFFh) | 5F5Ah | (AFFFh) | 0F5Ah | FFFFh | 0F5Ah | FFFFh |
| 000007h | 0F5Ah | FFFFh | 0F5Ah | 0F5Ah | FFFFh | 0F5Ah | FFFFh | 0F5Ah | FFFFh | 0F5Ah | FFFFh |
| 000008h | 0F5Ah | FFFFh | 0F5Ah | 0FFFh | (FFA5h) | 0F5Ah | FFFFh | 0F5Ah | FFFFh | 0F5Ah | FFFFh |
| 000009h | 0F5Ah | FFFFh | 0F5Ah | 0F5Ah | FFFFh | 0F5Ah | FFFFh | 0F5Ah | FFFFh | 0F5Ah | FFFFh |
| 00000Ah | 0F5Ah | FFFFh | 0F5Ah | 1F5Ah | (EFFFh) | 0F5Ah | FFFFh | 0F5Ah | FFFFh | 0F5Ah | FFFFh |
| 00000Bh | 0F5Ah | FFFFh | 0F5Ah | 0F5Ah | FFFFh | 0F5Ah | FFFFh | 0F5Ah | FFFFh | 0F5Ah | FFFFh |
| 00000Ch | 0F5Ah | FFFFh | 0F5Ah | 0F5Ah | FFFFh | 0F5Ah | FFFFh | 0F5Ah | FFFFh | 0F5Ah | FFFFh |
| 00000Dh | 0F5Ah | FFFFh | 0F5Ah | 0F7Ah | (0FDFh) | 0F7Ah | (0FDFh) | 0F7Ah | (0FDFh) | 0F5Ah | FFFFh |
| 00000Eh | 0F5Ah | FFFFh | 0F5Ah | 0F7Ah | (0FDFh) | 0F5Eh | (FFFBh) | 0F5Ah | FFFFh | 0F5Ah | FFFFh |
| 00000Fh | 0F5Ah | FFFFh | 0F5Ah | FFFFh | (0F5Ah) | 0F5Ah | FFFFh | 0F5Ah | FFFFh | 0F5Ah | FFFFh |

Fig. 10

SEMICONDUCTOR MEMORY DEVICE

CROSS REFERENCE TO RELATED APPLICATION

This Nonprovisional application claims priority under 35 U.S.C. §119(a) on patent application Ser. No. 2006-003408 filed in Japan on 11 Jan., 2006, the entire contents of which are hereby incorporated by reference.

BACKGROUND OF THE INVENTION

1. Field of the Invention

The present invention relates to a semiconductor and particularly to a semiconductor memory device provided with a buffer writing means for writing data at once into an address area, which includes a plurality of addresses, to be accessed, wherein the buffer writing means conducts a write action of writing simultaneously or continuously data into a group of memory cells determined by the addresses in the address area to be written, a batch verify action of subjecting simultaneously or continuously the memory cells determined by the addresses in the address area to be written to a verify action of examining whether the write action at the memory cells to be written has been completed or not, and repeats the write action and the batch verify action.

2. Description of the Related Art

As its communication has been speeded up and its storage size has been increased, a semiconductor memory device is now demanded for speeding up the writing action. For example, network apparatuses such as mobile telephones require semiconductor memory devices for conducting a write action at higher speeds. Most of the mobile telephones employ flash memories as nonvolatile memory device. Flash memories are commonly of a type of semiconductor memory devices for repeating the verity action and the write action. More specifically, as the write action often fails to be completed after only one time of its execution of writing data into the selected memory cells to be accessed in response to a command of starting the write action received from the outside, its completion can be ensured commonly by attempting a verify action of examining the presence of unwritten memory cells which have failed to be written, a re-write action of writing the data again into the unwritten memory cells, and repeating the verify action and the re-write action a desired number of times. Repeating the verify action and the re-write action is widely employed in not only flash memories or EEPROMs but also any applicable memory cells which are comparatively lower in the speed of the write action or unstable in the write action.

Also, for speeding up the write action, there is proposed a buffer writing means where the write action is conducted at once into a group of memory cells determined by their addresses. The use of such a buffer writing means is advantageous that the switching between the verify action and the re-write action is minimized and neither preparation nor post-action of the write action has to be carried out at each address. In brief, the use of the buffer writing means can comprehensively reduce the duration of time required for the action of writing data as compared with a conventional process of repeating at each address the verify action and the re-write action.

A method of controlling the action of a flash memory (referred to as a conventional device hereinafter) which includes a buffer writing means for repeating the verify action and the re-write action will now be explained referring to FIGS. 12 to 17. FIG. 12 is a block diagram illustrating an arrangement of the conventional device, where a section for conducting the buffer write action only is shown.

The conventional device includes a buffer writing means for writing 16 words of a data (one word consisting of 16 bits, for example) at once into a memory cell array to be targeted. It is also assumed as in a common NOR flash memory that the memory cell at its erased state is at "1" and the memory cell at its written state is at "0".

An input signal 511 received at an input/output circuit 510 from the outside is transferred to a user interface circuit 520 where it is analyzed. When the input signal 511 is a command for starting the write action, the user interface circuit 520 delivers a command signal 522 to a write buffer circuit 550 for storage of a write data. In response, the write buffer circuit 550 stores the write data prior to the write action.

When the input of the write data has been completed, the user interface circuit 520 delivers another command signal 521 to a write state machine circuit 530 for starting the write action. In response, the write state machine circuit 530 delivers a control signal 532 to a control address circuit 540 for controlling the control address and also other control signals 531 and 533 to an array control circuit 560 and the write buffer circuit 550 respectively for controlling their actions.

Upon receiving the control signal 532, the control address circuit 540 is updated at the control address and delivers a control address signal 541 to both the array control circuit 560 and the write buffer circuit 550. The control address signal 541 is received by the array control circuit 560 for selecting a group of the memory cells to be accessed in memory cell array 570 and by the write buffer circuit 550 for selecting a desired data to be written into the selected memory cells determined by the addresses from the stored data.

The write buffer circuit 550 delivers a data signal 551, which represents the data to be written selected by the control address signal 541, to the array control circuit 560.

In response, the array control signal 560 delivers the control signal 531, the control address signal 541, and the data signal 551 for controlling the action of the memory cell array 570. For example, the write action involves applying write pulses onto the selected memory cells in response to the control signal 561 and the verify action involves commanding an action of reading the selected memory cells and receiving the result of reading from a read data signal 571.

FIG. 13 is a circuitry diagram showing a part of the control address circuit 540. FIG. 14 is a circuitry diagram showing a register cell in the control address circuit 540 shown in FIG. 13. Both a signal DAT [3:0] and a signal WR are contained in the control signal 532. According to the signal DAT [3:0] and the signal WR, the write state machine circuit 530 updates the control address. A signal ADD [3:0] is a portion of the control address signal 541. The register cell shown in FIG. 14 incorporates a simple register circuit. When the signal WR is at "1", the control address is updated from the signal DAT. The resultant updated control address is released as the signal ADD. When the signal WR returns back to "0", the updated control address is latched.

FIG. 15 is a circuitry diagram showing an example of the write buffer circuit 550. FIG. 16 is a circuitry diagram showing a register cell REGCELL in the write buffer circuit 550 shown in FIG. 15. The register cell REGCELL incorporates a value sustainable register circuit. For the read action, a node RD is used as pulled up by the data control circuit.

An algorithm for conducting the buffer write action in the conventional device will be explained referring to FIG. 17. It is assumed that the write action fails when it has been executed at a given number of times but not completed.

The action of the algorithm starts with Step S601 for initializing a write counter which counts the number of times of the write action. Step S602 follows for presetting the verify voltage or a voltage to be applied to the word line for the selected memory cells.

At Step S603, the control address is initialized to designate a leading address in the area to be accessed for the buffer write action and clear the write flag. At Step S604, the verify read action is conducted in the selected memory cell determined by the control address.

At Step S605, the result of the verify action is taken. More specifically, the data read out from the selected memory cell is compared with an expected value saved in the write buffer circuit 550 to examine whether the write action has been completed or not and its comparison (the result of the verify action) is used for updating the value saved in the write buffer circuit 550. For example, the value of bit corresponding to the selected memory cell where the write action has been completed is shifted to "1" thus indicating that no more write action is needed at the selected memory cell.

At Step S606, when the value updated at Step S605 and saved in the write buffer circuit 550 indicates that the selected memory cell has to be subjected to the re-write action, the procedure goes to Step S607 for setting up a flag which indicates that the re-write action is needed. When the value updated at Step S605 and saved in the write buffer circuit 550 indicates that no selected memory cell has to be subjected to the re-write action, the flag needs not to be set up.

At Step S608, the control address is incremented. It is then examined at Step S609 whether the verify action has been completed at all the addresses or not. When it is judged that the verify action has not been completed, the procedure returns back to Step S604 for starting the verify action at the succeeding address. Through repeating the steps S604 to S609, the verify action can be conducted at all the addresses.

When the verify action has been completed at all the addresses and it is found at Step S610 that no selected memory cells to be written remain or the write flag is not set up throughout the steps S604 to S609, the buffer write action is ended and its procedure is closed (Step S611). Otherwise, when the memory cell to be written remains or the write flag is set up at any of the addresses throughout the steps S604 to S609, the procedure advances to Step S612 for updating the write counter.

At Step S613, when the count of the write counter reaches the upper limit of the number of repeats of the write action, it is judged that the write action fails and the procedure of the buffer write action is closed (Step S614). When the count of the write counter is lower than the upper limit of the number of repeats of the write action, the procedure goes to Step S615 for setting the write voltage. Since the write voltage to be applied to the selected word line and the selected bit line is different between the verify action and the write action, it has to be switched.

At Step S616, the control address is initialized. At Step S617, the write action at the selected address determined by the control address is then conducted. In case that the write action starts with no selected memory cell to be written allocated to the selected address, it can be canceled any time before the procedure goes to Step S618.

At Step S618, the control address is incremented. It is examined at Step S619 whether the write action at all the addresses has been completed or not. When not, the procedure returns back to Step S617 and the write action is repeated at the succeeding address. The write action at all the addresses can be completed through repeating the steps S617 to S619.

When the write action at all the addresses has been completed, the procedure returns back to Step S602 to start the verify action once again. The batch verify action and the write action can be repeated in this manner.

Another semiconductor memory device equipped with the write buffer circuit for speeding up the write action with the use of a buffer write function is also known where its control algorithm in the circuitry arrangement is simplified in order to further speed up the write action. Such a semiconductor memory device may be controlled, for example, by a masking circuit so that data saved in the write buffer circuit which needs to be not written remain not subjected to the write action over the memory cells (See Japanese Patent Laid-open Publication No. 2004-39112).

However, each of the conventional devices permits the buffer write action to involve the verify action at all the addresses, hence increasing the duration of time required for the batch verify action. FIG. 10 illustrates a table explaining steps of the buffer write action. The "address" column and the "data" column in the table represent addresses for the write action and data to be written at the addresses, respectively. Also, the first to fifth times of the verify action are provided for indicating a combination of (read) data in the memory cell to be read by the batch verify action and (buffer) data in the write buffer circuit 550 rewritten for reflecting the read data.

At the first time of the verify action, all the addresses at 16 words are verified. The buffer data remain unchanged since all the memory cells are at the erase state before the write action. Although the first time of the verify action may be omitted by the action of a means which is added to the conventional device for inhibiting the over-write action, its execution is desirable to detect any accidental over-write action. Similarly at the second time of the verify action, all the addresses at 16 words are verified. Accordingly, the write action is completed over 9 words out of 16 words (as expressed by FFFFh) while the remaining of 7 words (denoted in a parenthesis) is reserved for application of write pulses at the succeeding write action. At the third time of the verify action, all the addresses at 16 words are verified. Then, the write action is completed over 12 words out of 16 words while the remaining of 4 words is reserved for application of write pulses at the succeeding write action. At the fourth time of the verify action, all the addresses at 16 words are verified. Then, the write action is completed over 14 words out of 16 words while the remaining of 2 words is reserved for application of write pulses at the succeeding write action. Finally at the fifth time of the verify action, all the addresses at 16 words are verified. This permits the write action to be completed over all the 16 words. As described, the verify action in the conventional device has to be repeated as many as 80 times, thus increasing the duration of time required for completing the batch verify action.

SUMMARY OF THE INVENTION

It is hence an object of the present invention for eliminating the above drawback of the prior art to provide a semiconductor memory device arranged for minimizing the duration of time required for conducting a batch verify action and thus speeding up a buffer write action.

The semiconductor memory device according to the present invention is provided having a buffer writing means for writing data in a lump into an address area to be written including a plurality of addresses, the buffer writing means conducting a write action of writing simultaneously or continuously data into memory cells in an area determined by a plurality of addresses to be written in the address area, a batch verify action of subjecting simultaneously or continuously memory cells in an area determined by a plurality of addresses to be written in the address area to a verify action of examining whether or not the write action at the memory cells to be written has been completed, and repeating the write action and the batch verify action, and characterized in that the buffer writing means includes a detecting means for detecting whether or not each address contains an unwritten memory cell during the verify action and conducts a verify action at least at a part of the batch verify action excluding at least a part of addresses judged not to contain unwritten memory cells by the verify action conducted at one or more cycles before.

The semiconductor memory device according to the present invention may be modified in which the buffer writing means is arranged to conduct a write action at least at a part of the write action excluding at least a part of addresses judged not to contain unwritten memory cells by the verify action conducted at one or more cycles before.

The semiconductor memory device according to the present invention may be modified in which the detecting means is arranged to save one or more of the unwritten addresses including memory cells judged to be unwritten during the verify action and the buffer writing means is arranged to conduct the verify action just after the write action through selecting only the unwritten addresses judged by the verify action conducted at one cycle before sequentially from the detecting means.

The semiconductor memory device according to the present invention may be modified in which the buffer writing means is arranged to conduct the write action through selecting only the unwritten addresses judged by the preceding verify action sequentially from the detecting means.

Since the semiconductor memory device according to the present invention examines whether or not the address contains the unwritten memory cell, its verify action can be omitted at least partially at the addresses which need not to be subjected to the verify action or ideally carried out only at the unwritten addresses which contain the unwritten memory cells. This will reduce the number of times of the verify action, minimizing the duration of time required for conducting the batch verify action and thus speeding up the buffer writing action.

Since the semiconductor memory device according to the present invention examines whether or not the address contains the unwritten memory cell, its write action can be omitted at least partially at the addresses which need not to be subjected to the write action or ideally carried out only at the unwritten addresses which contain the unwritten memory cells. This will reduce the number of times of the write action, minimizing the duration of time required for repeating the write action and thus speeding up the buffer writing action.

BRIEF DESCRIPTION OF THE DRAWINGS

FIG. 10 is a table explaining the buffer write action;

DETAILED DESCRIPTION OF THE INVENTION

Embodiments of the present invention will be described in the form of a flash memory (referred to as an inventive device hereinafter) referring to the relevant drawings. The description is based on differences from the conventional device described above.

First Embodiment

Figure 1:
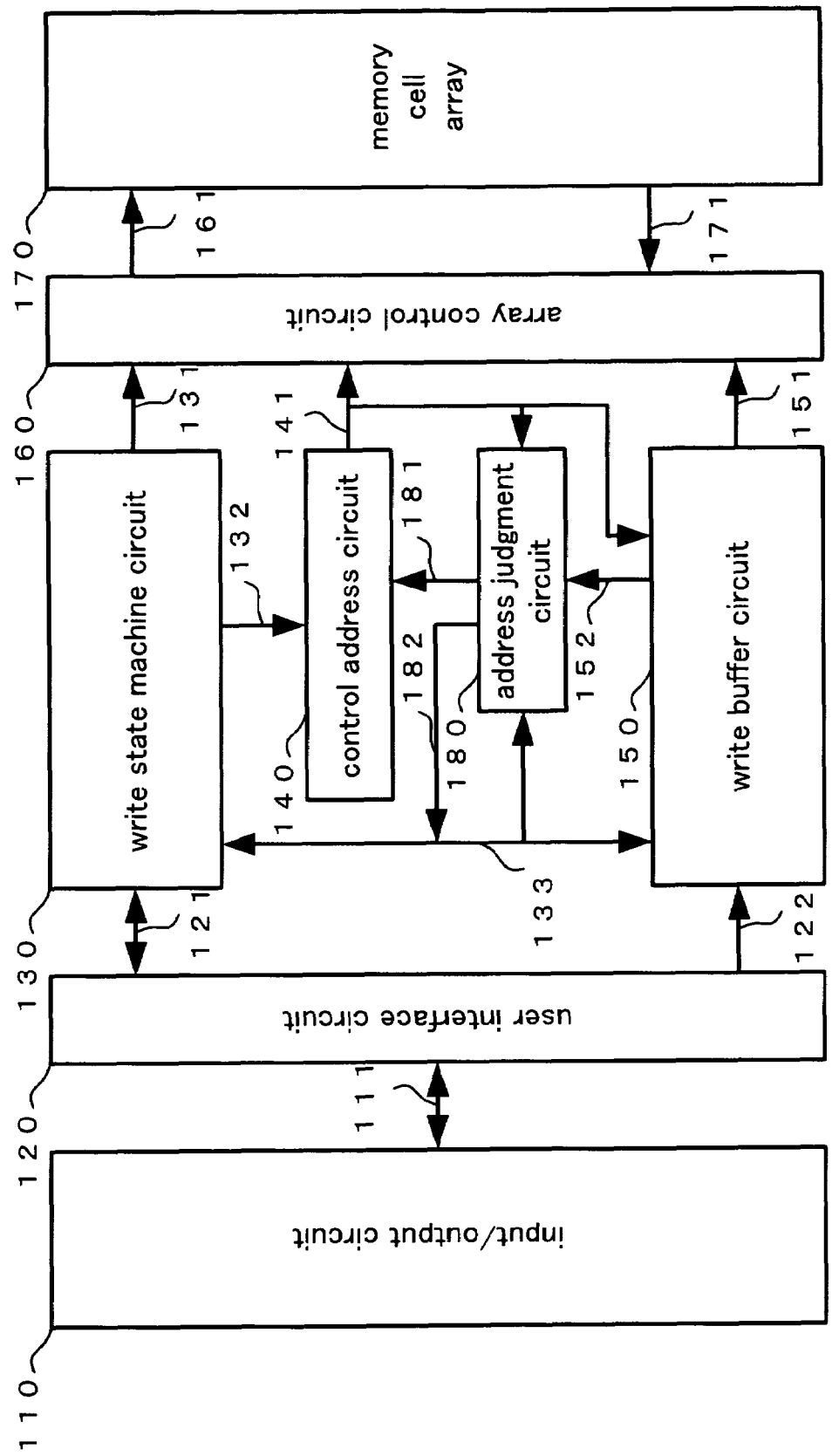
FIG. 1 is a block diagram showing an arrangement of the first embodiment of a semiconductor memory device according to the present invention.

The first embodiment of an inventive device will first be described. FIG. 1 is a block diagram showing an arrangement of the first embodiment. Illustrated is a buffer writing section of the arrangement.

This inventive device includes a buffer writing means for writing a data of 16 words (one word consisting of 16 bits) at once into an array of memory cells. For representing the data, according to the way of representing data of a common NOR flash memory, the memory cell at its delete state shall be "1" while the memory cell at its written state shall be "0".

The inventive device is a semiconductor memory device designed to conduct a batch verify action of examining whether or not all the memory cells in an address area to be accessed for buffer writing have been subjected to the writing action in a succession, a write action of writing the data simultaneously or continuously into the memory cells which have been targeted but not written, and a repeat action of repeating the batch verify action and the write action until it is judged that the action of writing the data into all the memory cells in the address area to be accessed has been completed. As shown in FIG. 1, the inventive device has the buffer writing means (110, 120, 130, 140, 150, 160, and 180) for writing a data at once into memory cells in an address area to be written which includes two or more addresses, and an array of memory cells 170.

The buffer writing means (110, 120, 130, 140, 150, 160, and 180) includes a detecting means (a part of the write buffer circuit 150) for examining whether or not the each address contains the memory cells which have not yet been written. Accordingly, the batch verify action of the inventive device allows only unwritten addresses to be subjected to its verifying action while the other addresses at which the write action has been completed or determined to involve no need of the write action are neglected.

Figure 12:
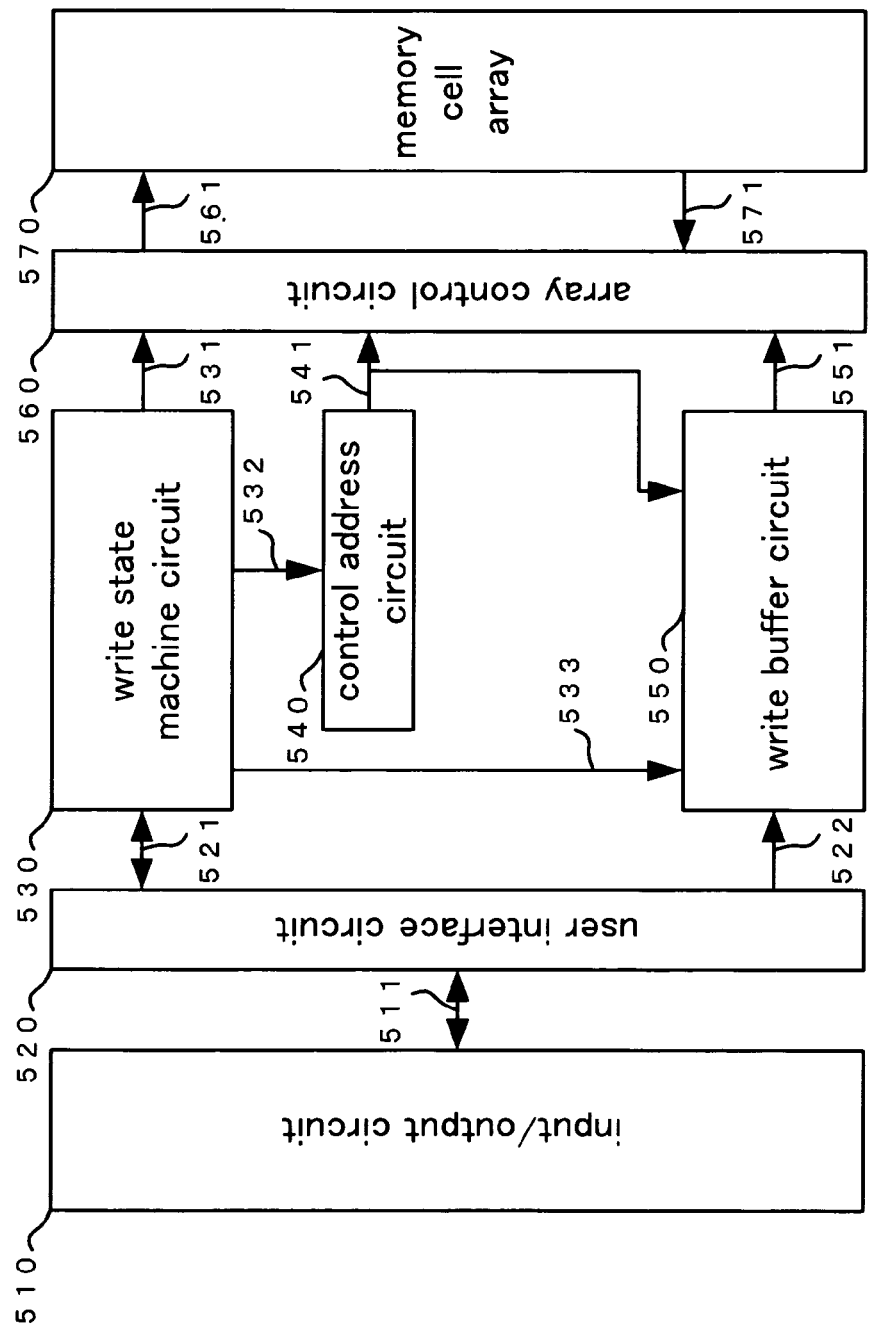
FIG. 12 is a block diagram showing an arrangement of a conventional semiconductor memory device.
Figure 13:
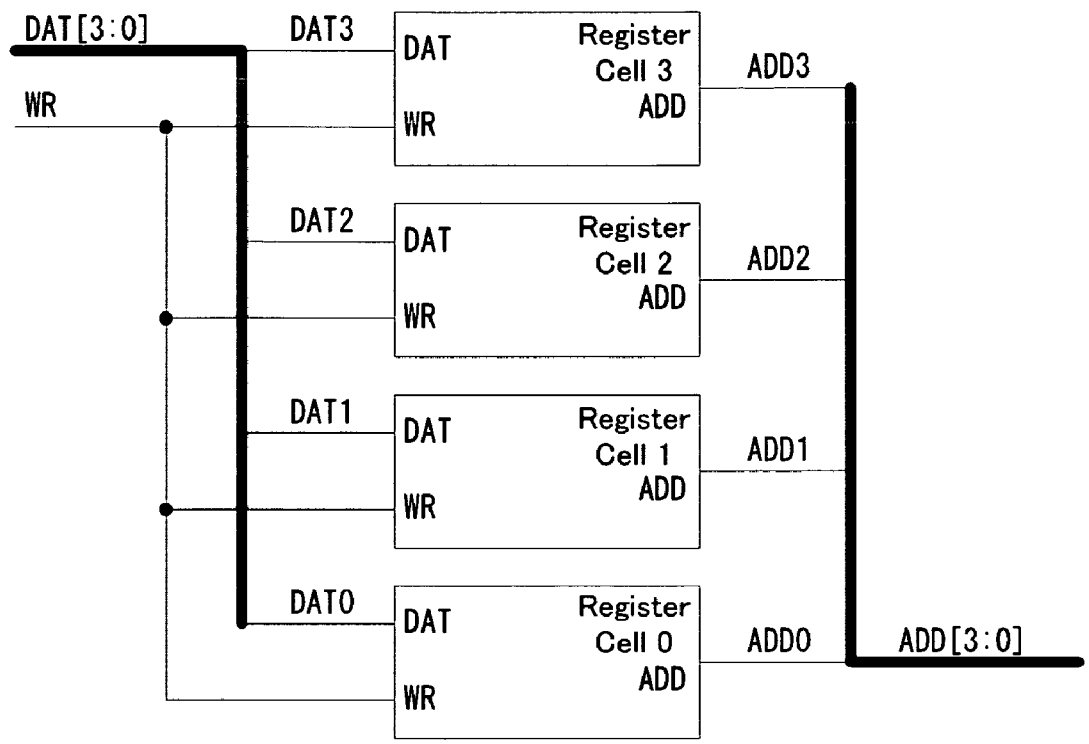
FIG. 13 is a circuitry diagram showing a control address circuit in the conventional semiconductor memory device.
Figure 14:
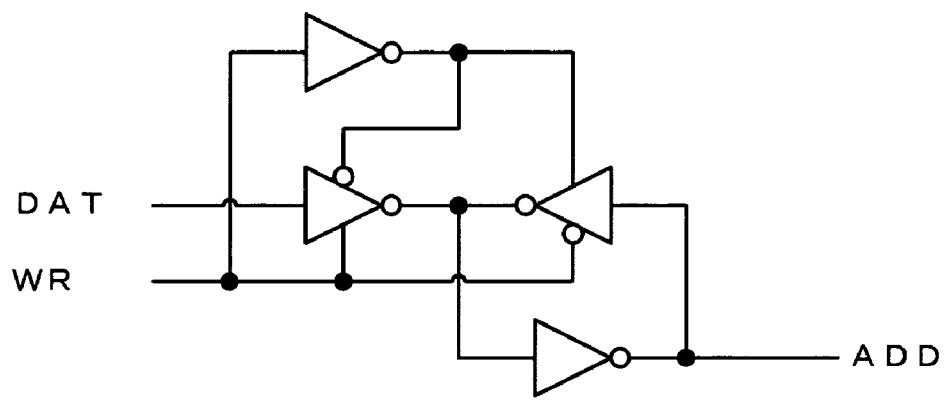
FIG. 14 is a circuitry diagram showing a register cell in the control address circuit shown in FIG. 13.
Figure 15:
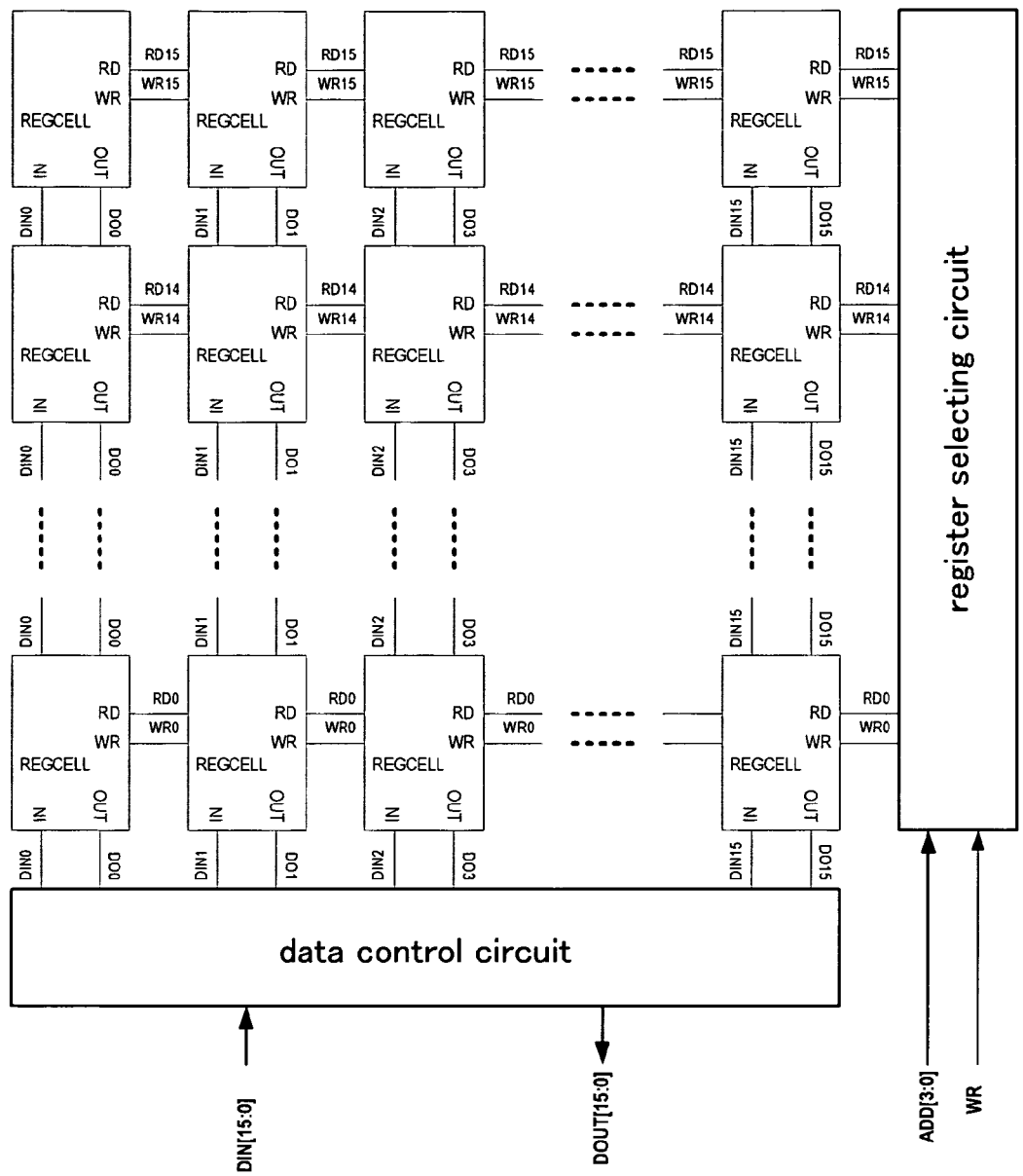
FIG. 15 is a circuitry diagram showing a write buffer circuit in the conventional semiconductor memory device.
Figure 16:
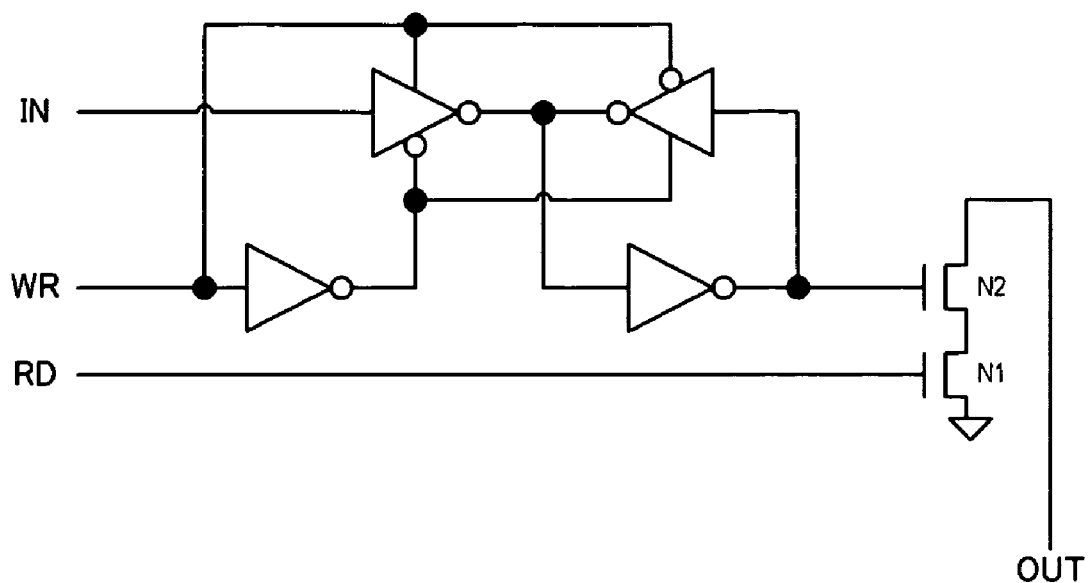
FIG. 16 is a circuitry diagram showing a register cell REG-CELL in the write buffer circuit shown in FIG. 15.
Figure 17:
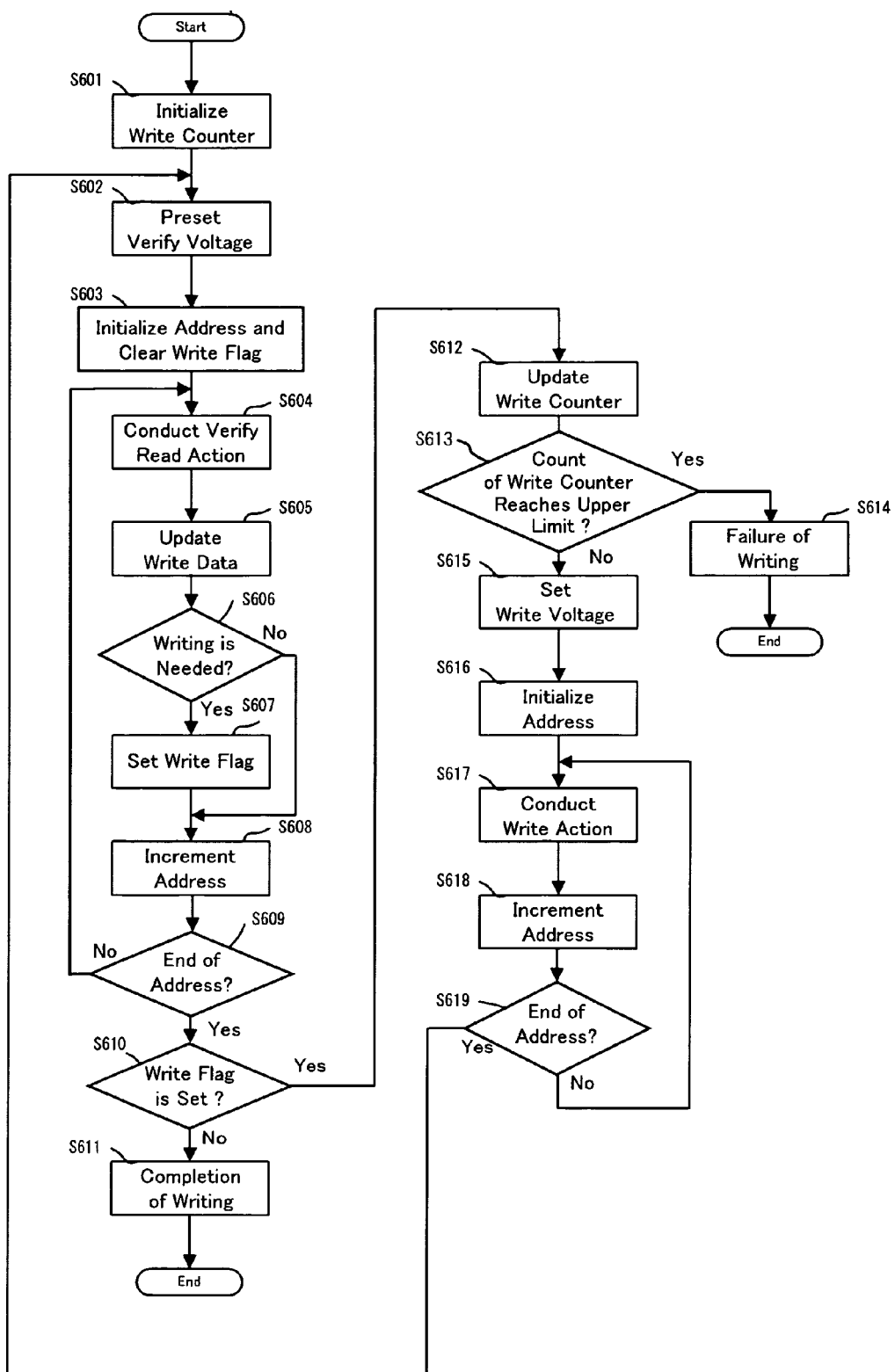
FIG. 17 is a flowchart showing an algorithm for conducting a buffer write action in the conventional semiconductor memory device.

In the inventive device, an input/output circuit 110, a user interface circuit 120, an array control circuit 160, a memory cell array 170, a signal 111, a signal 121, a signal 122, a control signal 161, and a readout data signal 171 are equal in the function to the input/output circuit 510, the user interface circuit 520, the array control circuit 560, the memory cell array 570, the signal 511, the signal 521, the signal 522, the control signal 561, and the readout data signal 571 in the conventional device respectively shown in FIG. 12 and will be described in no more detail.

A write state machine circuit 130 is provided for functioning equal to the write state machine circuit 530 in the conventional device and additionally controlling the action of an address judgment circuit 180 with the use of a control signal 533.

The write buffer circuit 150 has the same function as of the write buffer circuit 550 in the conventional device and also includes a circuit for examining whether or not the write action at each address of the memory cell is needed to select each word in a 16 words data. In action, the write buffer circuit 150 examines whether or not the write action is needed at each of the addresses and generates a pulsed judgment signal 152. When the memory cell to be written is present, the address is judged as an unwritten address. In other words, the write buffer circuit 150 acts as a means for detecting one or more unwritten addresses.

The address judgment circuit 180 comprises a decode circuit for decoding the control address which is being selected and a pulse judgment circuit for generating another address signal 181 indicative of the succeeding unwritten address and a write action completion signal 182 indicative of the presence of another unwritten address which follow the selected address. In action, the address judgment circuit 180 generates another address signal 181, and a write action completion signal 182 from a decode signal generated by its decode circuit, a control signal 133 to be released from the write state machine circuit 130, a control address signal 141, a pulsed judgment signal 152. The another address signal 181 is received by the control address circuit 140. The write action completion signal 182 is received by both the write state machine circuit 130 and the write buffer circuit 150. The address decode circuit in the address judgment circuit 180 may be replaced by the decode circuit in the write buffer circuit 150 since its function is identical to that of the address decode in the write buffer circuit 150.

The control address circuit 140 can not only update the control address to an address defined by the write state machine circuit 130 but also shift the control address to an unwritten address defined by the another address signal 181. The control address circuit 140 delivers its control address signal 141 to the array control circuit 160, the write buffer circuit 150, and the address judgment circuit 180. The control address signal 141 is used by the array control circuit 160 for selecting the memory cells to be written in the memory cell array 170 and by the write buffer circuit 150 for selecting desired one of the write data to be written into the memory cell at the selected address. In addition, the control address signal 141 is used by the address judgment circuit 180 for selecting desired unwritten address data from the unwritten address data.

Figure 2:
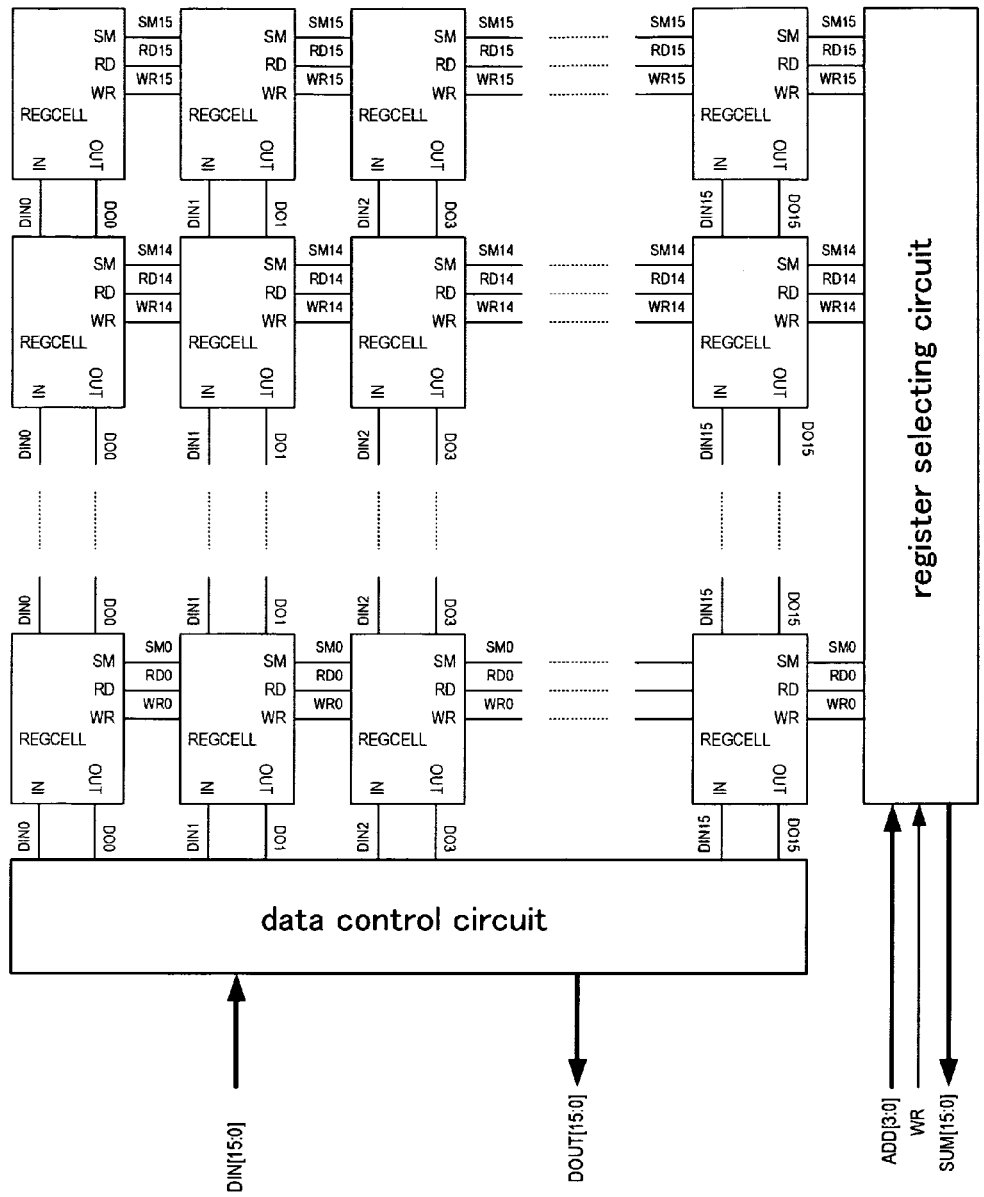
FIG. 2 is a circuitry diagram showing a write buffer circuit in the semiconductor memory device according to the present invention.
Figure 3:
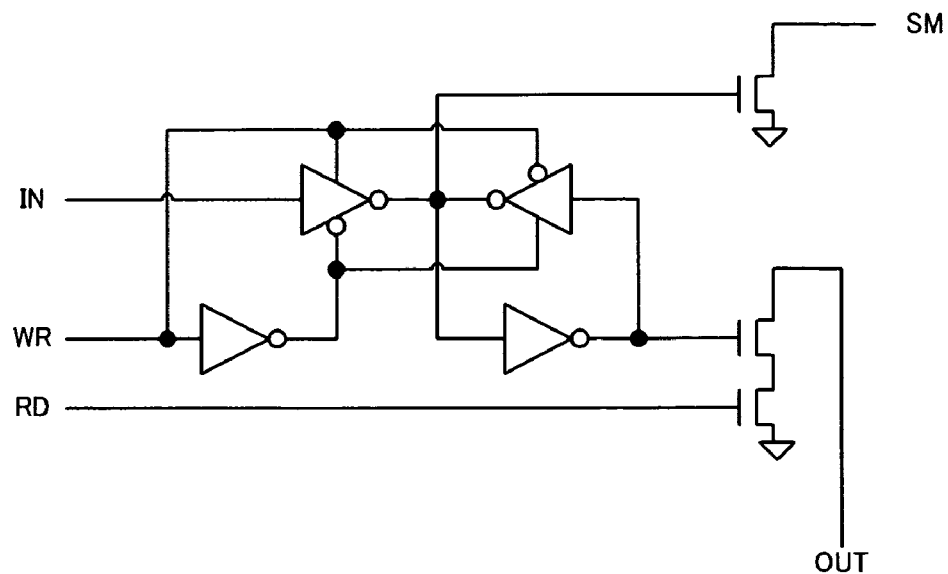
FIG. 3 is a circuitry diagram showing a register cell REG-CELL in the write buffer circuit shown in FIG. 2.
Figure 4:
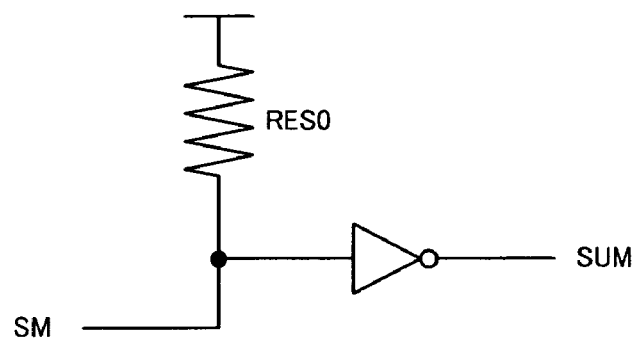
FIG. 4 is a circuitry diagram showing a pull-up circuit at the node SM and an inverter circuit for delivering a signal SUM both provided in the register selecting circuit shown in FIG. 2.

FIG. 2 is a circuitry diagram showing an arrangement of the write buffer circuit 150. FIG. 3 is a circuitry diagram showing an arrangement of the register cell REGCELL in the write buffer circuit 150. FIG. 4 is a circuitry diagram showing a pull-up circuit at the node SM and an inverter circuit for inverting the signal at the node SM, both provided in the register selecting circuit shown in FIG. 2. The register cells at each row in the write buffer circuit 150 are arranged to save a write data of one word (at one address) at the initial state.

The node for a signal SM [15:0] represents the address for the write data of 16 words and has a function of examining whether the action of writing the word into at least one memory cell determined by the address is needed or not. Its resultant judgment signal is released as a signal SUM [15:0]. The signal SUM [15:0] contains a bit of "1" assigned to the unwritten address to be subjected to the write action and its other bits are at "0".

As shown in FIG. 3, the register cell REGCELL is arranged for lowering the potential at the node SM to a low level (for example, equal to the grounding voltage) when the write action is needed.

As shown in FIG. 4, the inverter circuit at the node SM delivers the SUM signal at "1" when the node SM remains at the low level (the logic 0). When the node SM is not the low level with no unwritten memory cells needed for the write action, the inverter circuit is pulled up by a resistor RES0 to turn to the high level (the logic 1) and release the SUM signal at "0".

Figure 5:
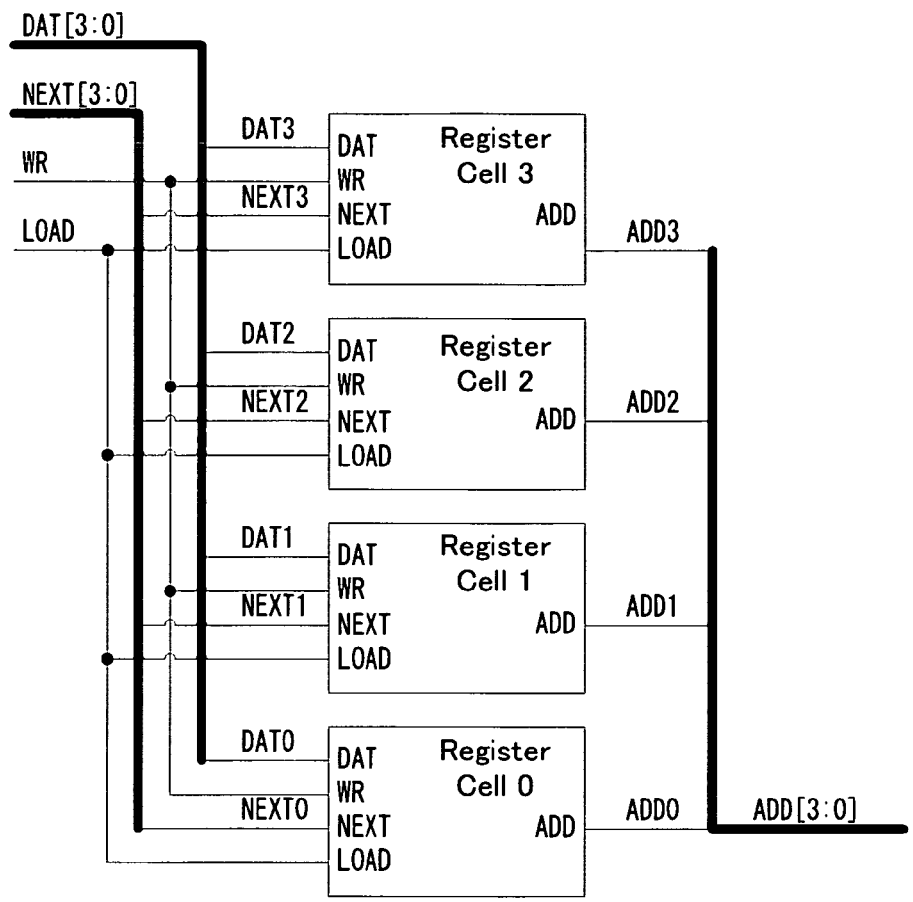
FIG. 5 is a circuitry diagram showing a control address circuit in the semiconductor memory device according to the present invention.
Figure 6:
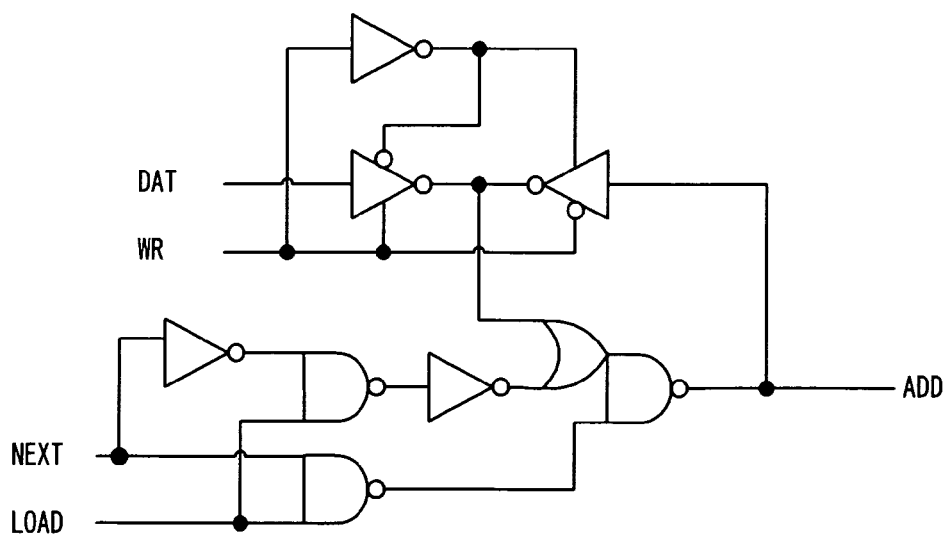
FIG. 6 is a circuitry diagram showing a register cell in the control address circuit shown in FIG. 5.

FIG. 5 is a circuitry diagram showing a part of the control address circuit 140. FIG. 6 is a circuitry diagram showing an arrangement of the register cell in the control address circuit 140. The control address circuit 140 has the same function as of the control address 540 in the conventional device and also includes a function of shifting the control address to another address signal 181 generated by the address judgment circuit 180. The another address signal 181 is denoted by NEXT [3:0]. When the LOAD signal is at "1", the control address is updated to a signal NEXT [3:0].

Figure 7:
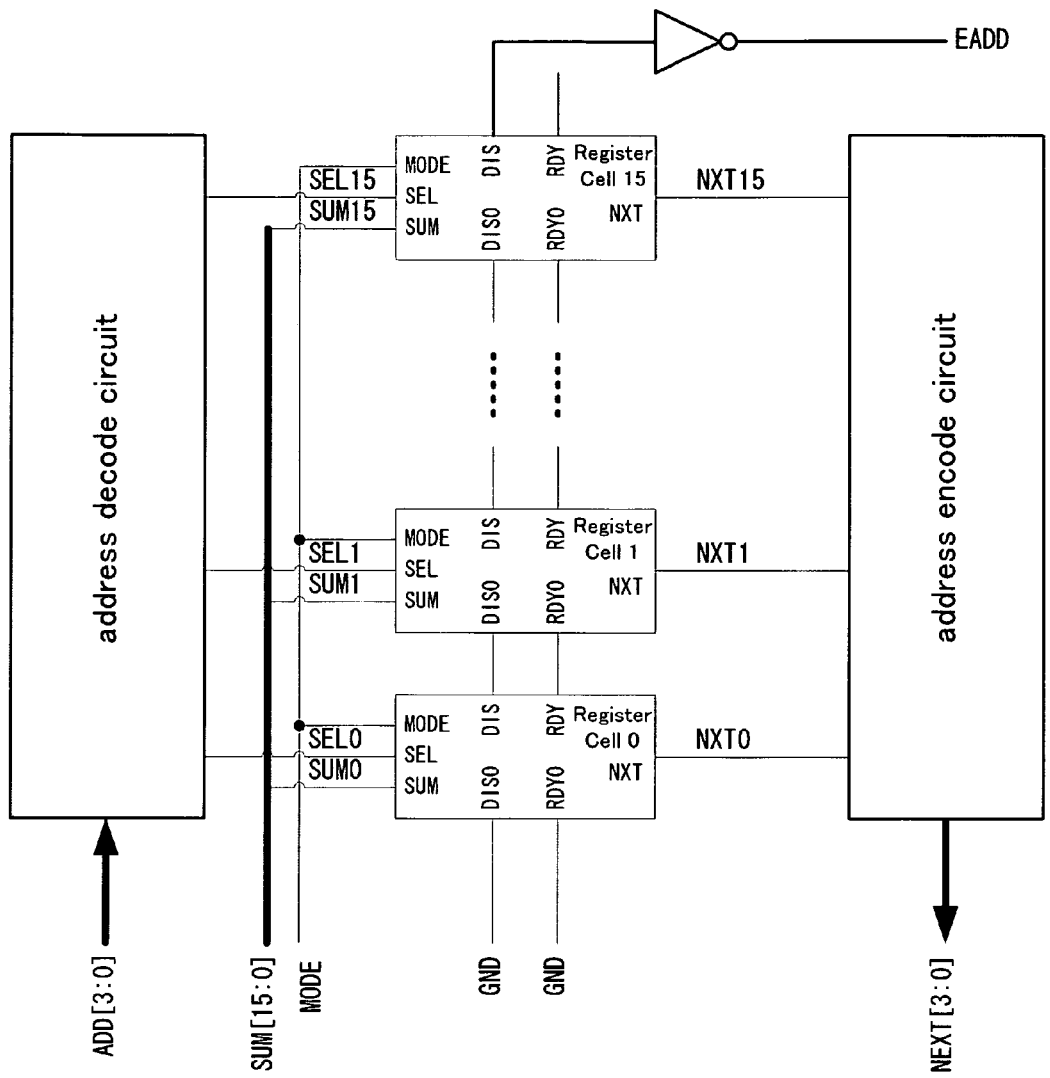
FIG. 7 is a circuitry diagram showing an address judgment circuit in the semiconductor memory device according to the present invention.
Figure 8:
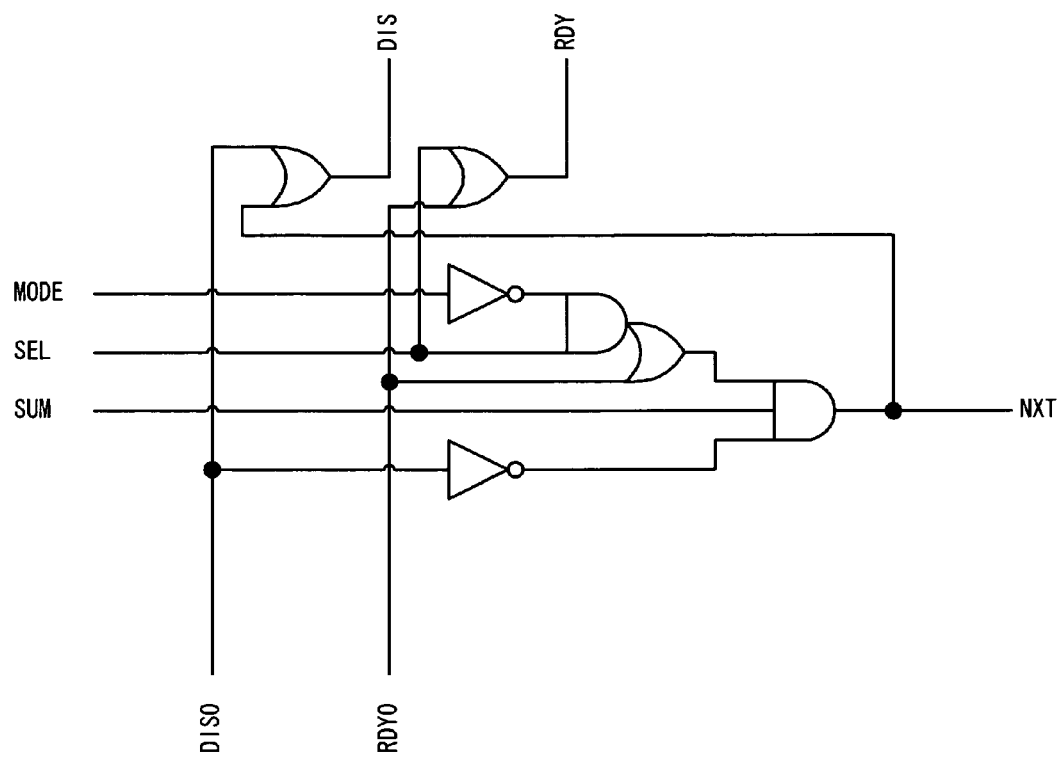
FIG. 8 is a circuitry diagram showing a part of the address judgment circuit shown in FIG. 7.

FIG. 7 is a circuitry diagram showing an arrangement of the address judgment circuit 180. FIG. 8 is a circuitry diagram showing each judgment circuit in the arrangement shown in FIG. 7. The judgment circuits 0 to 15 are arranged for, when their assigned address are unwritten addresses to be selected, delivering signals NXT0 to NXT15 at "1" respectively. As shown, an address decode circuit is provided for decoding the signal ADD [3:0] to develop a group of signals SEL0 to SEL15. Also shown is an address encode circuit for encoding the signals NXT0 to NXT15 to develop the signal NEXT [3:0]. The two circuits are well known and will be explained in no more detail. The signal SUM [15:0] represents the pulsed judgment signal 152 generated in the write buffer circuit 150. When the memory cell to be written is present at the address, the signal SUM [15:0] turns to "1". When no memory cell to be written is present at the address, the same signal turns to "0".

The judgment circuit shown in FIG. 8 may conduct two different actions in response to a MODE signal. When the MODE signal is at "0" and the address assigned to the judgment circuit is the first unwritten address after the currently selected address or the address selected by the address decode circuit, the judgment circuit delivers the NXT signal at "1". When the MODE signal is at "1" and the address assigned to the judgment circuit is another address (not the currently selected address) which follows the currently selected address and is the first unwritten address, the judgment circuit delivers the NXT signal at "1". As the NXT signal is at "1", an input signal DIS is delivered at "1". The DIS signal indicates that the selection of the succeeding unwritten address has been completed and permits no more selection of the unwritten address. The judgment circuit at the currently selected address delivers an RDY signal at "1". The judgment circuit at the succeeding address receives from the preceding stage the RDY signal as RDY0 which indicates that the address judgment circuit is at the upper level than the currently selected address. The RDY signal allows the address at the upper level than the currently selected address to be exclusively determined as a candidate of the unwritten address.

The DIS signal delivered from the judgment circuit 15 is at "1" when the unwritten address is present in the data address area to be written. When no unwritten address is present in the data address area, the DIS signal is at "0" and the EADD signal turns to "1". In other words, the EADD signal acts as a write completion signal 182.

Figure 9:
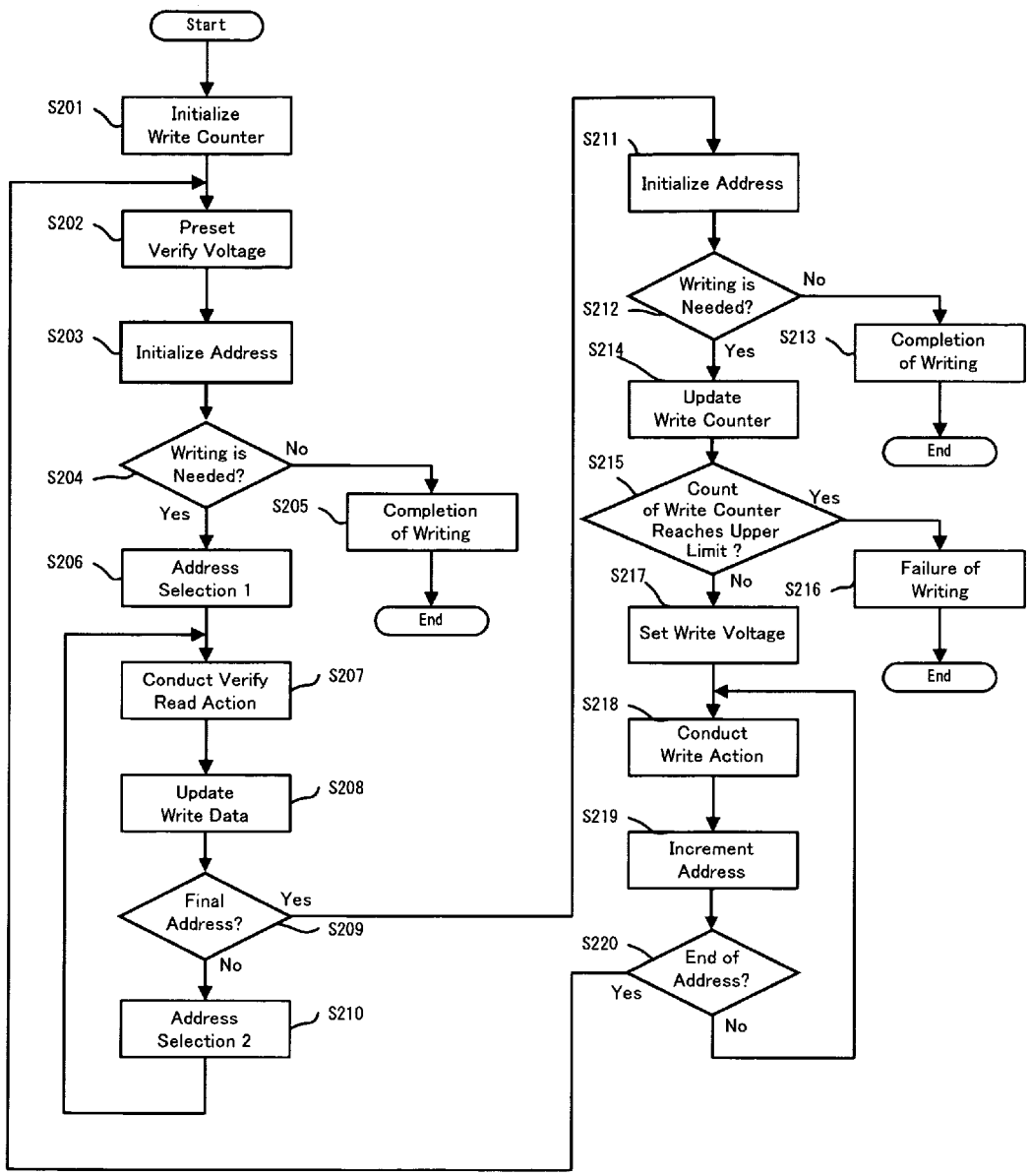
FIG. 9 is a flowchart showing an algorithm for conducting a buffer write action in the first embodiment of the semiconductor memory device according to the present invention.

An algorithm of the buffer write action in the first embodiment will now be described referring to FIG. 9. It is assumed that the write action fails when it has not been completed after a given number of times of the action.

Steps S201 to S203 are substantially equal to those of Steps S601 to S603 described with the conventional device, although the step of providing an unwanted write flag is absent in this embodiment, and will be explained in no more detail.

At Step S204, the write completion signal 182 is examined to determine whether the write action is required or not. When not, it is judged that the write action steps have been completed and the procedure of the buffer write action is closed (Step S205). When the write action is required, the procedure goes to Step S206 for shifting the control address to the unwritten address which includes the current control address (selecting the unwritten address). At the time, with the MODE signal held at "0", the control address is updated using the LOAD signal.

At Step S207, the verify read action is conducted at the unwritten address defined by the control address. At Step S208, the result of the verify action is taken. More specifically, the data read out by the verify read action is compared with an expected value saved in the write buffer circuit 150 to examine whether the write action has been completed or not and its comparison (the result of the verify action) is used for updating the value saved in the write buffer circuit 150. For example, the value or bit assigned to the selected memory cell of which the write action has been completed is shifted to "1" thus indicating that no more write action is needed at the selected memory cell.

It is then examined at Step S209 whether the unwritten address is present or not after the current control address. When the unwritten address is present, the procedure goes to Step S210 for shifting the control address to the succeeding unwritten address. With the MODE signal held at "1", the control address is updated using the LOAD signal. The procedure then returns to Step S207 for conducting the verify action at the succeeding unwritten address. By repeating the action at Steps S207 to S210, the verity action can be conducted at all the unwritten addresses. The verify action is conducted through selectively picking up the unwritten addresses in a succession.

It is judged at Step S209 that no unwritten address at the upper level than the current control address is present, the procedure of the verify action is closed and the control address is then initialized at Step S211. It is examined at Step S212 whether or not the verify action judges that the write action has been completed at the unwritten memory cell. This step also employs the write completion signal 182. When it is judged that the write action has been completed, a series of the write actions have been completed and the procedure of the buffer write action is closed (Step S213).

It is judged at Step S212 that the write action at the unwritten memory cell has not been completed, the procedure moves to Step S214 for updating the write counter.

At Step S215, when the count of the write counter reaches the upper limit of the number of repeats of the write action, it is judged that the write action fails and the procedure of the buffer write action is closed (Step S216). When the count of the write counter is lower than the upper limit of the number of repeats of the write action, the procedure goes to Step S217 for setting the write voltage.

At Step S218, the write action is conducted. Even if no selected memory cell to be written is present at the selected address, the write action may be called. In such a case, the write action at the address is canceled on the way and the procedure goes to Step S219. At Step S219, the control address is incremented.

It is examined at Step S220 whether the write action at all the addresses has been completed or not. When not, the procedure returns back to Step S218 and the write action is repeated at the succeeding address. The write action at all the addresses can be completed through repeating the steps S218 to S220. When the write action at all the addresses has been completed, the procedure returns back to Step S202 to start the verify action once again. The batch verify action and the write action can be repeated in this manner.

As described, according to the first embodiment, the buffer write action can be carried out at all the memory cells to be written. At any address where no unwritten memory cell is present, the verify action is not repeated. Since the memory cell at that address is not subjected to the write action during the verify action, its result remains unchanged regardless of the verify action. Accordingly, even when the verify action is canceled, it will create no interruption. An exemplary procedure of the buffer write action will be explained referring to FIG. 10 used for description of the conventional device.

At the first time of the verify action, all the addresses at 16 words are verified similar to those of the conventional device. Since the verify action is conducted before the write action, the memory cells to be verified remain substantially at the erase state.

At the second time of the verify action, all the addresses at 16 words are verified similar to those of the conventional device. Accordingly, the write action is completed over 9 words out of 16 words (as expressed by FFFFh) while the remaining of 7 words (denoted in a parenthesis) is determined as the unwritten addresses and reserved for application of write pulses at the write action. At the third time of the verify action, the unwritten addresses at 7 words are verified dissimilar to those of the conventional device. Then, the write action is completed over 3 words out of 7 words at the second time of the verify action while the remaining of 4 words is determined as the unwritten addresses and reserved for application of write pulses at the write action. At the fourth time of the verify action, the unwritten addresses at 4 words are verified. Then, the write action is completed over 2 words out of 4 words at the third time of the verify action while the remaining of 2 words is reserved as the unwritten addresses for application of write pulses at the write action. Finally at the fifth time of the verify action, the unwritten addresses at 2 words are verified. This permits the write action to be completed over the 2 words at the fourth time of the verify action. As understood, the verify action in the first embodiment is repeated as small as 45 times. While the conventional device permits the verify action to be repeated 80 times, the first embodiment can significantly be decreased in the number of times of the verify action.

As described, the first embodiment allows one or more unwritten addresses which include the unwritten memory cells to be selectively picked up and subjected to the verify action, hence decreasing the number of times for repeating the verify action, minimizing the duration of time required for conducting the batch verify action, and further speeding up the buffer write action.

Second Embodiment

Figure 11:
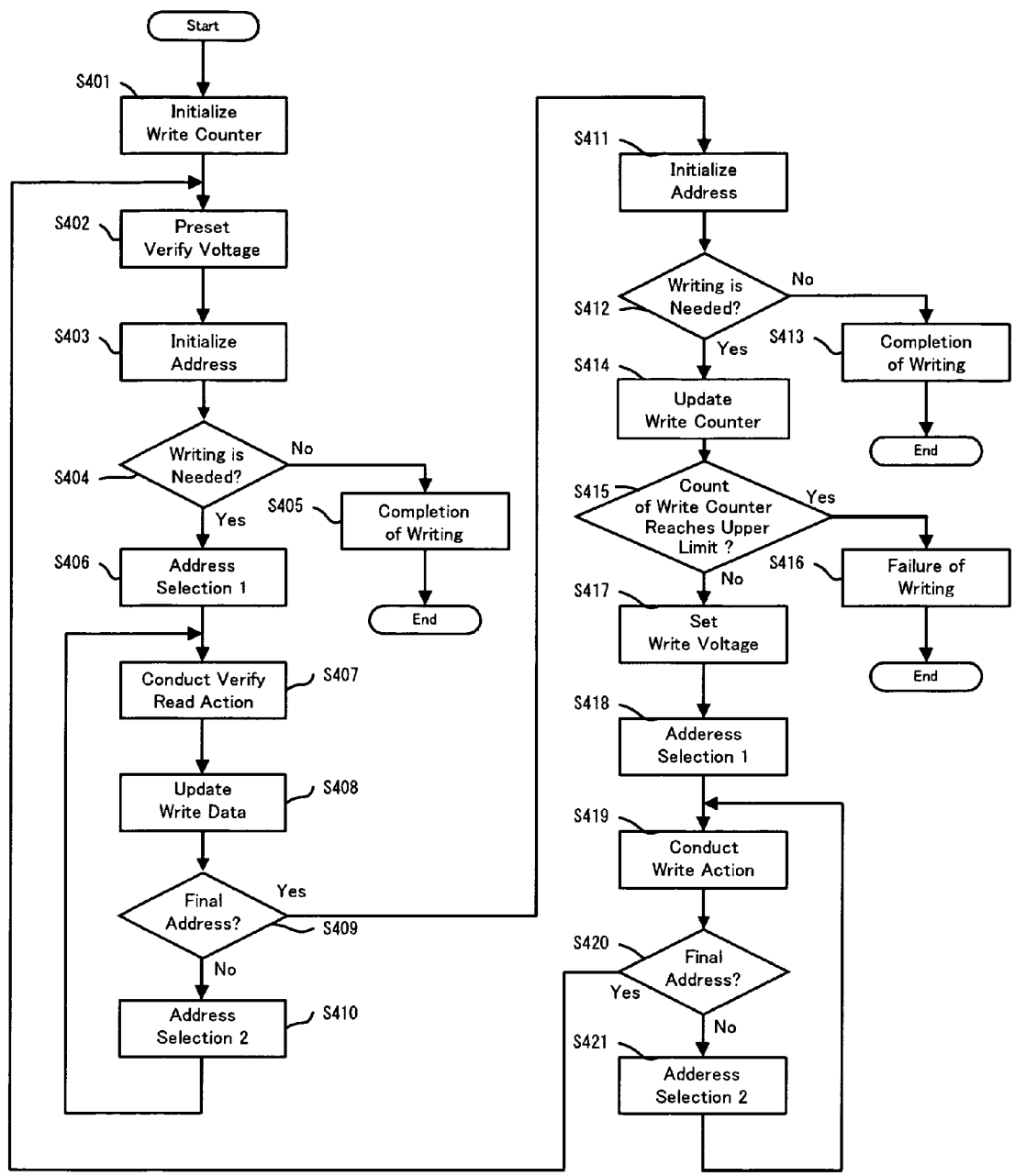
FIG. 11 is a flowchart showing an algorithm for conducting a buffer write action in the second embodiment of the semiconductor memory device according to the present invention.

The second embodiment of the inventive device will be described referring to FIG. 11. The second embodiment is differentiated from the first embodiment in the algorithm of the buffer write action to be controlled by the write state machine circuit.

Steps S401 to S417 are substantially equal to those of Steps S201 to S217 of the first embodiment and will be explained in no more detail.

At Step S418, the control address is shifted to the unwritten address to be written including the current control address. With the MODE signal held at "0", the control address is updated using the LOAD signal.

At Step S419, the write action is conducted at the unwritten address defined by the control address. At the time, the unwritten address definitely contains an unwritten memory cell to be written.

It is then examined at Step S420 whether the write action at all the unwritten addresses has been completed or not. More particularly, it is examined whether or not an unwritten address is present before the current control address. This step employs the write completion signal 182. When an unwritten address is present, the procedure goes to Step S421 for shifting the control address to the succeeding unwritten address. With the MODE signal held at "1", the control address is updated using the LOAD signal. Since the write action is conducted through selecting the unwritten addresses in a succession, it involves no other addresses than the unwritten addresses. In the conventional device, the write action involves other addresses than the unwritten addresses. As described, the write action is canceled at the other addresses on the way and jumped to the succeeding address for speeding up. Since the second embodiment permits the write action to be conducted at optimum modes, it can further be increased in the speed of the write action.

When it is judged at Step S420 that no unwritten address is present after the current control address, the procedure returns back to Step S402 and repeats the verify action and the write action.

As set forth above, although the second embodiment is similar to the first embodiment in the duration of time required for conducting the verify action, can omit the write action only at the unwanted addresses which need not to be written, hence increasing the speed of the buffer write action.

Other Embodiments (1) Although the foregoing embodiments permit the write action to be examined whether it is needed or not at the write buffer circuit, a further embodiment may be provided with equal success which includes a specific circuit (referred to as a pulse register circuit) for saving the result of judgment whether the write action at each memory cell is needed or not and receiving a write data to be set for conducting the write action. More specifically, the pulse register circuit which replaces the write buffer circuit may be arranged to generate the pulse judgment signal.

(2) A further embodiment of the inventive device may be provided which includes not a circuit for statically detecting an unwritten address but a circuit for saving the result of judgment whether an unwritten memory cell is present at its address during the verify action (referred to as an unwritten flag register circuit) in order to generate the pulse judgment signal.

(3) A further embodiment of the inventive device may be provided which has a page mode reading function for reading at once the memory cells assigned to two or more addresses, wherein the verify action in the buffer write action utilizes the page mode reading function thus to provide the equal effect. When the page mode reading function is used during the verify action, each page including the unwritten memory cell has to be subjected to the verify action. In that case, an address generating circuit is used for detecting an address to be shifted or unwritten address at each page.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A semiconductor device comprising:
a buffer writing device that writes a datum in an address area including a plurality of addresses,
wherein the datum written in the address area is written in a lump;
wherein the buffer writing device is configured to simultaneously or continuously write the datum into a plurality of memory cells;
wherein the buffer writing device is configured to perform a batch verification of the simultaneously or continuously written datum, the batch verification examining whether the datum recorded in the plurality of memory cells has been completed;
wherein the buffer writing device includes a detector having a judging action that judges whether each of the plurality of addresses contains an unwritten memory cell during the batch verification action;
wherein the buffer writing device is configured to conduct a verification action at least at a part of the batch verification action excluding a part of the addresses judged not to contain unwritten memory cells by the verification action conducted at a one or more cycles before; and
wherein the buffer writing device is configured to repeat the writing action and the batch verification action.

2. The semiconductor memory device of claim 1,
wherein the buffer writing device is configured to conduct a write action at least at a part of the write action excluding at least a part of addresses judged not to contain unwritten memory cells by the verification action conducted at one or more cycles before.

3. The semiconductor memory device of claim 1,
wherein the detecting device is configured to save one or more of the unwritten addresses including one or more memory cells judged to be unwritten during the verification action; and
wherein the buffer writing device is configured to conduct the verification action just after the write action by selecting only the unwritten addresses judged by the verification action conducted at one cycle before sequentially from the judging action of the detector.

4. The semiconductor memory device of claim 3,
wherein the buffer writing device is configured to select only the unwritten addresses judged by the preceding verification action sequentially from the judging action of the detector.

* * * * *